(12) United States Patent
Wang

(10) Patent No.: US 11,177,016 B2
(45) Date of Patent: Nov. 16, 2021

(54) NON-VOLATILE MEMORY DEVICE AND ERASING OPERATION METHOD THEREOF

(71) Applicant: Winbond Electronics Corp., Taichung (TW)

(72) Inventor: Jui-Wei Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/885,246

(22) Filed: May 27, 2020

(65) Prior Publication Data
US 2020/0381074 A1 Dec. 3, 2020

(30) Foreign Application Priority Data
May 30, 2019 (TW) .................................. 108118715

(51) Int. Cl.
| | | |
|---|---|---|
| G11C 29/50 | (2006.01) | |
| G11C 29/00 | (2006.01) | |
| G11C 7/10 | (2006.01) | |
| G11C 16/14 | (2006.01) | |
| G11C 16/12 | (2006.01) | |
| G11C 29/44 | (2006.01) | |

(52) U.S. Cl.
CPC ...... *G11C 29/50004* (2013.01); *G11C 7/1012* (2013.01); *G11C 16/12* (2013.01); *G11C 16/14* (2013.01); *G11C 29/44* (2013.01); *G11C 29/789* (2013.01)

(58) Field of Classification Search
CPC . G11C 29/50004; G11C 7/1012; G11C 16/12; G11C 16/14; G11C 29/44; G11C 29/789
See application file for complete search history.

(56) References Cited

U.S. PATENT DOCUMENTS

| | | | | |
|---|---|---|---|---|
| 7,941,590 B2 * | 5/2011 | Yang | ...................... | G11C 16/28 711/103 |
| 8,036,044 B2 | 10/2011 | Dong et al. | | |
| 8,645,793 B2 * | 2/2014 | Wu | ................... | G11C 29/50004 714/763 |

(Continued)

FOREIGN PATENT DOCUMENTS

| | | |
|---|---|---|
| CN | 105989887 | 10/2016 |
| KR | 20100064005 | 6/2010 |

*Primary Examiner* — Vanthu T Nguyen
(74) *Attorney, Agent, or Firm* — JCIPRNET

(57) ABSTRACT

A non-volatile memory device and an erasing operation method thereof are provided. The non-volatile memory device includes a main memory cell region and a control circuit electrically connected to the main memory cell region. The main memory cell region has a plurality of memory cells. The control circuit is configured to perform an erasing operation on the memory cells, wherein the control circuit is configured to: obtain a current threshold voltage of the memory cell to be erased; calculate a difference between the current threshold voltage and an original threshold voltage to obtain a voltage shift value, wherein the original threshold voltage represents the pre-delivery threshold voltage of the memory cells; adjust an erase verify voltage level according to the voltage shift value; and determine whether the erasing operation is completed according to the adjusted erase verify voltage level.

14 Claims, 4 Drawing Sheets

(56) References Cited

U.S. PATENT DOCUMENTS

| | | | | |
|---|---|---|---|---|
| 8,797,805 B2* | 8/2014 | Shen | ............... | G11C 16/0483 |
| | | | | 365/185.24 |
| 9,042,181 B2* | 5/2015 | Flynn | ............... | G11C 16/3445 |
| | | | | 365/185.19 |
| 9,047,955 B2 | 6/2015 | Cometti et al. | | |
| 9,070,460 B2* | 6/2015 | Yano | ............... | G11C 16/16 |
| 9,153,336 B1* | 10/2015 | Yang | ............... | G11C 16/3422 |
| 9,349,489 B2* | 5/2016 | Desireddi | ............... | G06F 12/0246 |
| 9,645,177 B2* | 5/2017 | Cohen | ............... | G11C 16/3418 |
| 9,741,402 B2* | 8/2017 | Jeon | ............... | G11C 11/5642 |
| 10,497,446 B2* | 12/2019 | Takizawa | ............... | G11C 16/0483 |
| 2015/0049548 A1* | 2/2015 | Park | ............... | G11C 16/349 |
| | | | | 365/185.11 |

* cited by examiner

NON-VOLATILE MEMORY DEVICE AND ERASING OPERATION METHOD THEREOF

CROSS-REFERENCE TO RELATED APPLICATION

This application claims the priority benefit of Taiwan application serial no. 108118715, filed on May 30, 2019. The entirety of the above-mentioned patent application is hereby incorporated by reference herein and made a part of this specification.

BACKGROUND

Technical Field

The disclosure relates to a memory device, and particularly to a non-volatile memory device and an erasing operation method thereof.

Description of Related Art

In the related art, non-volatile memory devices that can save data after power-off become the main medium for storing data in current electronic products. Among various non-volatile memory devices, flash memory having advantages of power saving, small size, and rewritability are commonly used in mobile devices.

However, in the process of data access, the flash memory performs programming operation and erasing operation on the data in the memory cell. As the time of use increases, the threshold voltage of the memory cells of the flash memory may shift after a number of program-erase (P/E) cycles. To solve this problem, the applied bias voltage is gradually increased as the number of cycles increases. However, increasing the bias voltage will adversely affect the erasing operation of the memory cell, resulting in the possibility of accelerating the wear of the flash memory. Therefore, how to reduce the impact on flash memory after multiple P/E cycles becomes an important issue.

SUMMARY

The disclosure provides a non-volatile memory device and an erasing operation method thereof, which can avoid the problem that the life of the memory decreases as the number of P/E cycles increases.

A non-volatile memory device according to an embodiment of the disclosure includes a main memory cell region having a plurality of memory cells and a control circuit. The control circuit is electrically connected to the main memory cell region for performing erasing operation on the memory cell. The control circuit is configured to perform the following steps to complete the erasing operation: obtaining a current threshold voltage of the memory cell to be erased; calculating a difference between the current threshold voltage and an original threshold voltage to obtain a voltage shift value, wherein the original threshold voltage represents the pre-delivery threshold voltage of the memory cells; adjusting an erase verify voltage level according to the voltage shift value; and determining whether the erasing operation is completed according to the adjusted erase verify voltage level.

An erasing operation method for a non-volatile memory device including a plurality of memory cells according to an embodiment of the disclosure includes the steps of: obtaining a current threshold voltage of a memory cell to be erased; calculating a difference between the current threshold voltage and an original threshold voltage to obtain a voltage shift value, wherein the original threshold voltage represents the pre-delivery threshold voltage of the memory cells; adjusting an erase verify voltage level according to the voltage shift value; and performing an erasing operation on the memory cell, wherein the erasing operation includes determining whether the erasing operation is completed according to the adjusted erase verify voltage level.

Based on the above, the non-volatile memory device and the erasing operation method thereof in the disclosure monitor the threshold voltage of the memory cell, and adjust the erase verify voltage level according to the voltage shift values obtained from the difference between the current threshold voltage and the original threshold voltage, wherein the original threshold voltage represents the threshold voltage of the memory cells which have not undergone multiple program-erase cycles. By adjusting the erase verify voltage level, it is possible to prevent the non-volatile memory device from applying additional bias voltage due to the shift of the threshold voltage when erasing the data, resulting in the problem of memory cell loss.

In order to make the aforementioned features and advantages of the disclosure more comprehensible, embodiments accompanying figures are described in detail below.

DESCRIPTION OF THE EMBODIMENTS

Figure 1:
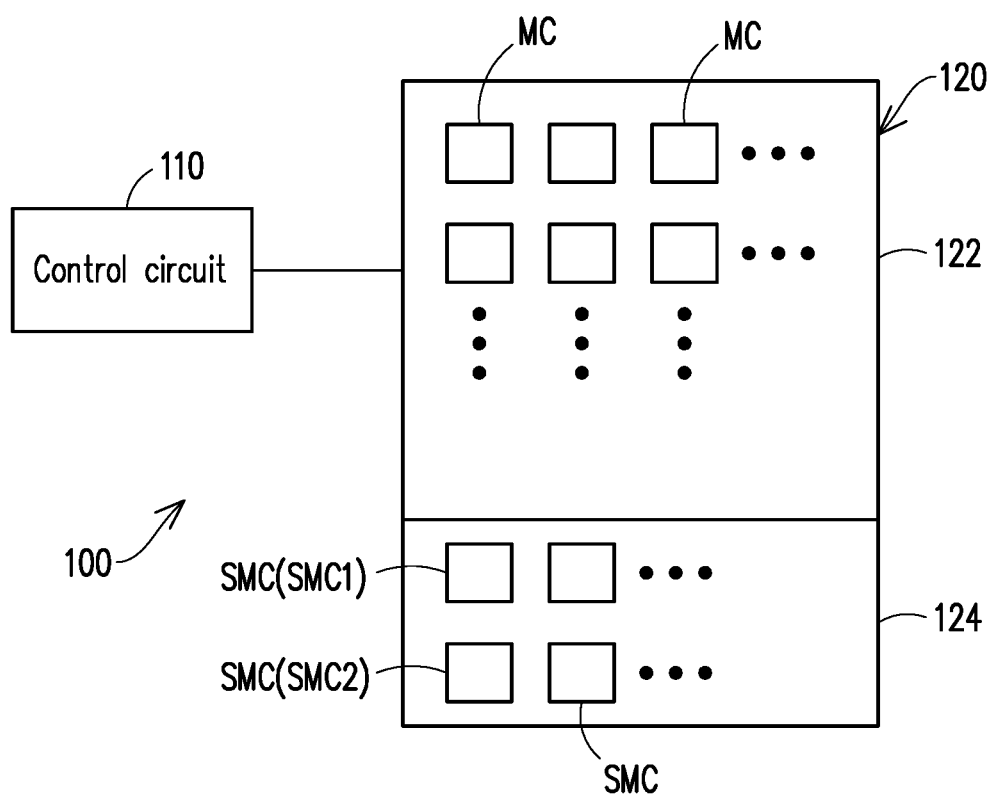
FIG. 1 is a schematic view of a non-volatile memory device according to an embodiment of the disclosure.

FIG. 1 is a schematic view of a non-volatile memory device according to an embodiment of the disclosure. Referring to FIG. 1, a non-volatile memory device 100 includes a control circuit 110 and a memory cell array 120, wherein the memory cell array 120 includes a main memory cell region 122 composed of a plurality of memory cells MC and a spare memory cell region 124 composed of a plurality of spare memory cells SMC. The memory cell array 120 is, for example, an NAND gate memory array, but is not limited thereto. The control circuit 110 is electrically connected to the memory cell array 120 for performing an accessing operation on the memory cell array 120, such as a programming operation, a reading operation, or an erasing operation.

The main memory cell region 122 can store data, and the spare memory cell region 124 can store system data (e.g., error correction codes). When some memory cells MC in the main memory cell region 122 are damaged, a part of the spare memory cells SMC (for example, the spare memory cell SMC1) in the spare memory cell region 124 can replace those bad memory cells MC to maintain the normal function of the non-volatile memory device 100, but another part of the spare memory cells SMC (e.g., the spare memory cell SMC2) in the spare memory cell region 124 maintain unused after delivery.

Figure 2:
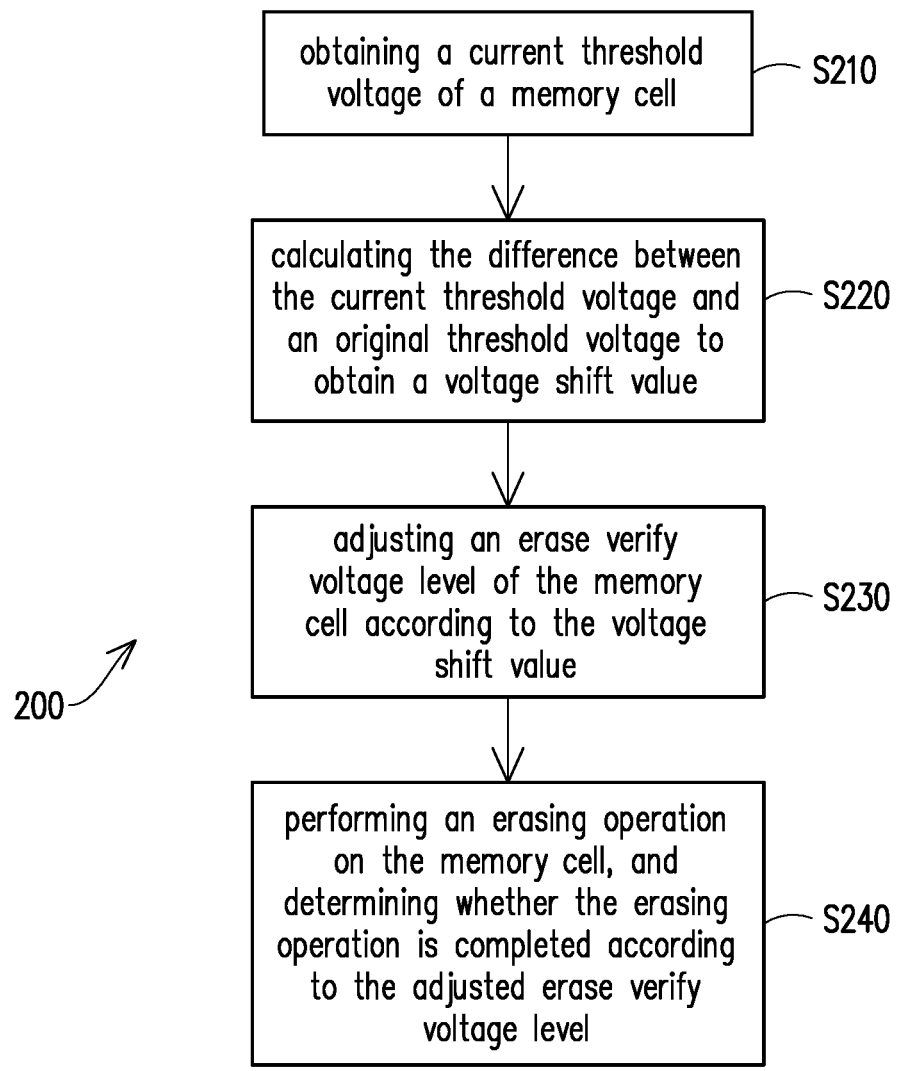
FIG. 2 is a flow chart of an erasing operation method of a non-volatile memory device according to an embodiment of the disclosure.

FIG. 2 is a flow chart of an erasing operation method of a non-volatile memory device according to an embodiment of the disclosure. The erasing operation method 200 can be adapted for the non-volatile memory device 100 of FIG. 1, and the specific implementation of the erasing operation method 200 will be specifically described below with reference to the elements of the non-volatile memory device 100.

In step S210, the control circuit 110 obtains a current threshold voltage of a memory cell MC in the main memory cell region 122. In particular, in one embodiment, the current threshold voltage may be the current threshold voltage of one designated memory cell MC to be accessed in the main memory cell region 122. In another embodiment, the current threshold voltage may be an average of the current threshold voltages of all (or selected) memory cells MC in the main memory cell region 122. In another embodiment, the current threshold voltage may be the median or the majority value of the current threshold voltages of all (or selected) memory cells MC in the main memory cell region 122. In step S220, the control circuit 110 calculates the difference between the current threshold voltage and an original threshold voltage to obtain a voltage shift value, wherein the original threshold voltage represents the pre-delivery threshold voltage of the memory cells MC, that is, the threshold voltage of the memory cells MC that have not been used by consumers and have not undergone multiple program-erase cycles. In an embodiment, the control circuit 110 can adopt an average (or the median or the majority value) of the threshold voltages of the plurality of spare memory cells SMC in the spare memory cell region 124 as the original threshold voltage. In an embodiment, the control circuit 110 can adopt the threshold voltage of the spare memory cell SMC which has not been used (e.g., the spare memory cell SMC2) as the original threshold voltage. In another embodiment, the original threshold voltage can be a pre-determined value stored in a register before or after the delivery of the non-volatile memory device 100. In particular, the register may store the pre-delivery threshold voltages of the memory cells MC, and the control circuit 110 may calculate the difference between the current threshold voltage of a selected memory cell MC and the original threshold voltage of the selected memory cell MC stored in the register to obtain the voltage shift value of the selected memory cell MC. It shall be noted that the control circuit 110 may obtain a plurality of voltage shift values when selecting multiple memory cells for accessing. Next, in step S230, the control circuit 110 adjusts the erase verify voltage level of the memory cells MC according to the voltage shift value. In step S240, the control circuit 110 performs an erasing operation on the memory cells MC, wherein the control circuit 110 determines whether the erasing operation of the memory cells MC is completed according to the erase verify voltage level adjusted in step S230.

Implementation of the erasing operation method of the non-volatile memory device will be further described below with other embodiments.

Figure 3:
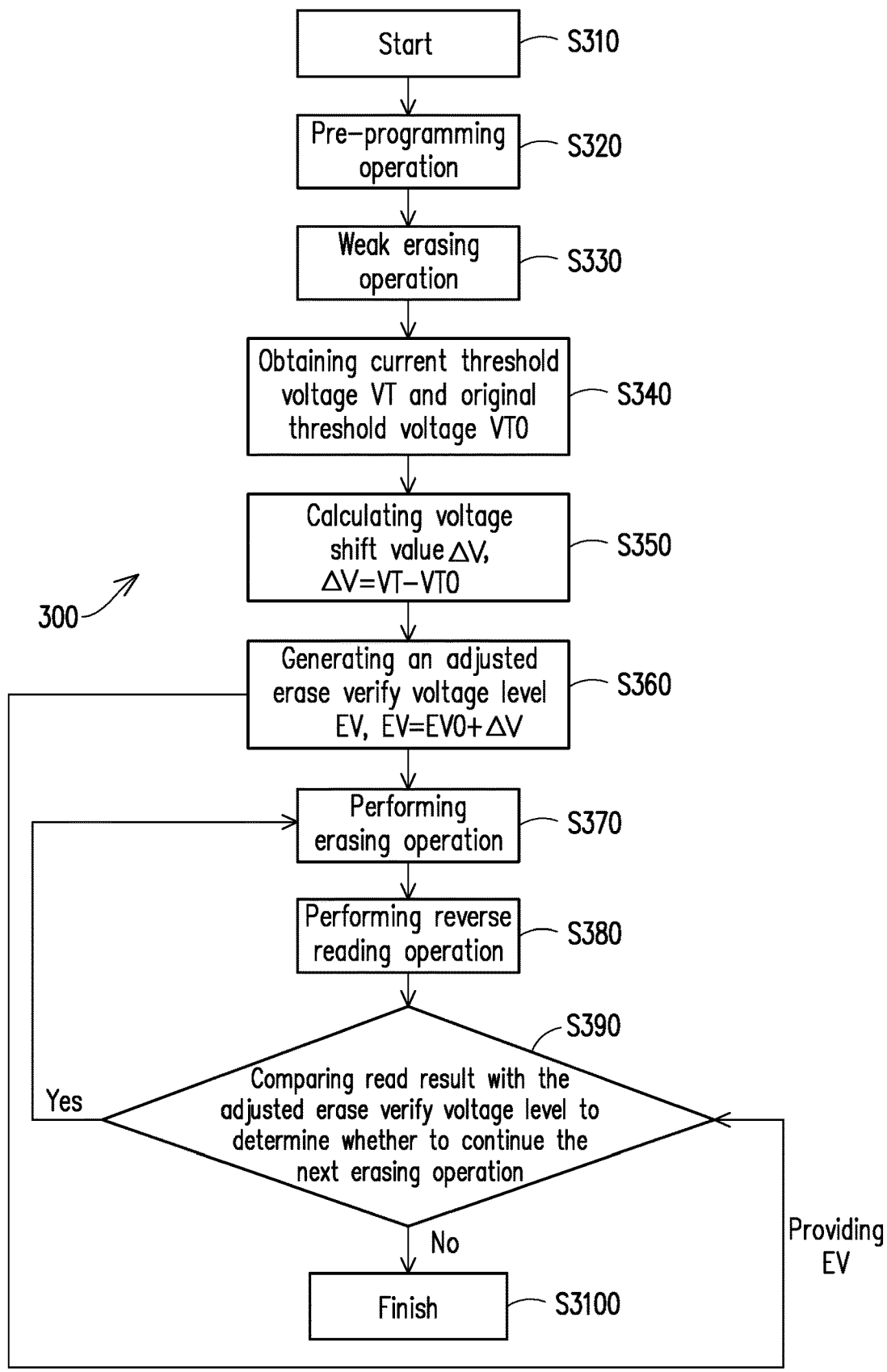
FIG. 3 is a flow chart of an erasing operation method of a non-volatile memory device according to another embodiment of the disclosure.
Figure 4A:
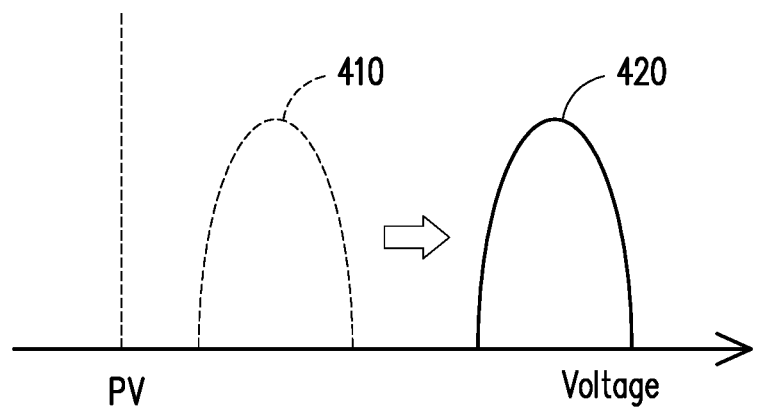
FIG. 4A-FIG. 4C are schematic views showing a threshold voltage distribution of a memory cell according to an embodiment of the disclosure.
Figure 4B:
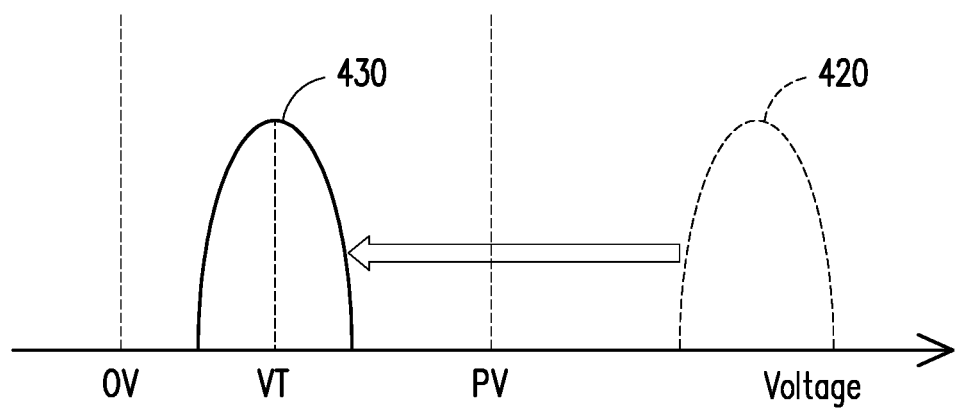
Figure 4C:
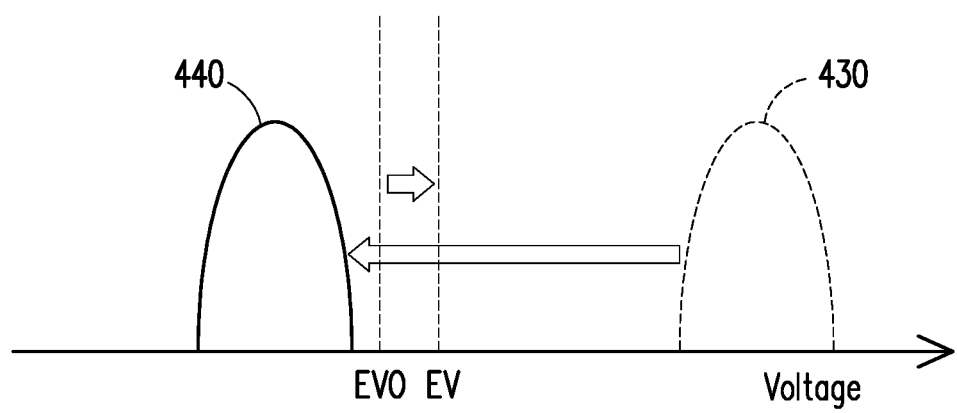

FIG. 3 is a flow chart of an initial erasing operation method of a non-volatile memory device according to another embodiment of the disclosure. FIG. 4A-FIG. 4C are schematic views showing a threshold voltage distribution of a memory cell according to an embodiment of the disclosure. The initial erasing operation method 300 of FIG. 3 can be adapted for the non-volatile memory device 100 and the erasing operation method 200 described above. A specific implementation of the initial erasing operation method 300 will be described below with reference to FIG. 1 and FIG. 4A to FIG. 4C.

In this embodiment, an average of the threshold voltages of the plurality of spare memory cells SMC after weak erase is taken as the original threshold voltage, and influence of the number of P/E cycles on the memory region 120 is reflected through the difference between the threshold voltage values of the memory cells MC and the spare memory cells SMC, and the erase verify voltage level is adjusted along with the number of P/E cycles to prevent the wear of the memory cell region 120, i.e. improve the endurance of the non-volatile memory device 100.

In step S310, the control circuit 110 starts an initial erasing operation on the memory cell array 120. In step S320, the control circuit 110 performs a pre-programming operation on the memory cell array 120 (including the memory cells MC and the spare memory cells SMC). The pre-programming operation is, for example, reinforced programming operation. The voltage or energy adopted by the reinforced programming operation is greater than the voltage or energy adopted by normal programming operation. In FIG. 4A, PV represents a program verify voltage level of the memory cells MC and the spare memory cells SMC, and a curve 410 represents a threshold voltage distribution of the memory cells MC and the spare memory cells SMC before performing step S320. After the pre-programming operation of step S320 is performed, the threshold voltage distribution of the memory cells MC and the spare memory cells SMC is shifted toward the right direction and changed into a curve 420.

Next, in step S330, the control circuit 110 performs a weak erasing operation on the memory cell array 120 (including the memory cells MC and the spare memory cells SMC). The voltage or energy adopted in the weak erasing operation is smaller than the voltage or energy adopted in normal erasing operation. In FIG. 4B, the threshold voltage distribution of the memory cells MC and the spare memory cells SMC is shifted from the curve 420 to the left to the curve 430 due to the operation in step S330. Specifically, after the weak erasing operation, the threshold voltage distribution of the memory cells MC and the spare memory cells SMC will substantially fall between 0 V (volts) and the program verify voltage level PV. Next, step S340 is performed, the control circuit 110 obtains the threshold voltages of the memory cells MC and the spare memory cells SMC. In particular, the control circuit 110 may calculate an average of the threshold voltages of the memory cells MC, and define the average of the threshold voltages of the memory cells MC as the current threshold voltages VT. The control circuit 110 may use an average of the threshold voltages of the spare memory cells SMC which have been undergone the weak erasing operation as the original threshold voltage VT0. In this embodiment, the current threshold voltages of the memory cells MC and the spare memory cells SMC is greater than 0 V and smaller than the program verify voltage level PV. In some embodiments, by performing steps S320 and S330, the current threshold voltages of the memory cells MC and the spare memory cells SMC can also be controlled within the range between 1V and the program verify voltage level PV.

It is noted that, in an embodiment, the control circuit 110 selects the threshold voltage of the spare memory cells SMC that have not been used in the spare memory cell region 124 after the weak erase as the original threshold voltage VT0 in the following step S350. That is to say, a part of the spare memory cells SMC in the spare memory cell region 124 can be reserved without being subjected to data accessing operation.

In short, before the memory cells MC are erased, the control circuit 110 can increase the threshold voltage of the memory cell array 120 through the pre-programming operation, thereby avoiding that the threshold voltage of the memory cell array 120 obtained after weak erase operation is too low. In other embodiments, the erasing operation method 300 may omit step S320.

In step S350, the control circuit 110 calculates the difference between the current threshold voltage VT of the memory cells MC and the original threshold voltage VT0 to obtain a voltage shift value $\Delta V$, that is, $\Delta V = VT - VT0$. In other words, in the present embodiment, the voltage shift value $\Delta V$ is the difference between the current threshold voltage values of the main memory cell region 122 and the spare memory cell region 124 (specifically the spare memory cells that have not been accessed) after weak erase.

In step S360, the control circuit 110 adds the initial erase verify voltage level EV0 to the voltage shift value $\Delta V$ to generate an adjusted erase verify voltage level EV, that is, $EV = EV0 + \Delta V$. The initial erase verify voltage level EV0 can be a pre-determined value, such as the erase verify voltage level of the fresh memory cell before delivery.

In step S370, the control circuit 110 applies an erase voltage on the memory cells MC to perform an erasing operation. In order to erase the data in the main memory cell region 122 more effectively, this embodiment uses the Incremental Step Pulse Erase (ISPE) method, but is not limited thereto. In detail, the control circuit 110 can set a plurality of erase voltages that are sequentially incremented, and perform multiple erasing operations on the memory cells MC according to the incremented erase voltages. When the first erasing operation is performed, the control circuit 110 sets the erase voltage to be equal to the first erase voltage, and performs a first erasing operation on the memory cells MC according to the first erase voltage. Then, if the subsequent verify reading operation fails, the control circuit 110 may set the erase voltage to be equal to the second erase voltage, wherein the second erase voltage is greater than the first erase voltage, and performs a second erasing operation on the memory cells MC according to the second erase voltage. In the same manner, the control circuit 110 can perform multiple erasing operations on the memory cells MC.

In step S380, after each erasing operation is performed, the control circuit 110 performs a verify reading operation on the memory cells MC, and here a reverse reading operation is taken as an example, but is not limited thereto. Next, in step S390, the control circuit 110 compares the verify read result of the reverse reading operation with the adjusted erase verify voltage level EV provided in step S360, and determines whether to continue the next erasing operation based on the comparison result.

In detail, after performing the first erasing operation on the memory cells MC, the control circuit 110 performs a verify reading operation on the memory cells MC, and determines whether to continue the next erasing operation according to the comparison result of the read result and the adjusted erase verify voltage level EV. The erase state of the memory cells MC can be determined through the verify reading operation, and the control circuit 110 can determine, according to the comparison result, whether all the memory cells MC are erased to the state where the threshold voltage thereof is smaller than the adjusted erase verify voltage level EV, thereby determining whether the erase is successful. If the verify read result indicates that the first erasing operation is unsuccessful, then return to step S370, and a second erasing operation is performed. Steps S370 to S390 are repeatedly executed until the control circuit 110 determines that all the memory cells MC have been successfully erased, and proceed to step S3100 to finish the erasing operation.

In FIG. 4C, after replacing the original initial erase verify voltage level EV0 with the adjusted erase verify voltage level EV, a threshold voltage distribution curve 430 of the memory cells MC undergoing the erasing operation will shift to the left. When a sufficient erase voltage is applied (i.e. at least one erasing operation is performed), the threshold voltage distribution of the memory cells MC is changed to the curve 440 from the curve 430, which is below the erase verify voltage level EV, and therefore the control circuit 110 completes the erasing operation (step S3100).

The above is an initial erasing operation method of a non-volatile memory device according to another embodiment of the disclosure. It should be noted that, for the spare memory cell region 124, steps S320 and S330 are only performed in the initial erasing operation. After the initial erasing operation is completed, in the subsequent erasing operation, steps S320 and S330 are only performed on the main memory cell region 122. Also, the initial erasing operation can be performed before or after delivery.

In summary, the non-volatile memory device and the erasing operation method thereof in the disclosure monitor the current threshold voltage of the memory cell to be erased and compare it with the original threshold voltage to obtain a voltage shift value, and adjust the erase verify voltage level according to the voltage shift value. In this way, the non-volatile memory device can adjust the erase verify voltage level with the increase of the number of P/E cycles to avoid the decrease of the life of memory cells due to voltage shift.

Although the disclosure has been disclosed in the above embodiments, it is not intended to limit the disclosure, and those skilled in the art can make some modifications and refinements without departing from the spirit and scope of the disclosure. Therefore, the scope to be protected by the disclosure is subject to the scope defined by the appended claims.

What is claimed is:

1. A non-volatile memory device, comprising:
   a main memory cell region, comprising a plurality of memory cells; and
   a control circuit, electrically connected to the main memory cell region, configured to perform an erasing operation on the plurality of memory cells by:
   obtaining a current threshold voltage of at least one of the memory cells to be erased, wherein the current threshold voltage is obtained from the at least one of the memory cells of the main memory cell region that have undergone a plurality of program-erase cycles;
   calculating a difference between the current threshold voltage and an original threshold voltage to obtain a voltage shift value, wherein the original threshold voltage represents a pre-delivery threshold voltage of the plurality of memory cells;
   adjusting an erase verify voltage level according to the voltage shift value;
   applying a first erase voltage on the at least one of the memory cells; and
   determining whether the erasing operation on the at least one of the memory cells is completed according to the adjusted erase verify voltage level,
   wherein the control circuit is configured to perform a weak erasing operation on the main memory cell region and a spare memory cell region before obtaining the current threshold voltage, and the current threshold voltage is greater than 0 volt and smaller than a program verify voltage level after the weak erasing operation.

2. The non-volatile memory device of claim 1, further comprising the spare memory cell region, wherein the spare memory cell region comprises a plurality of spare memory cells, wherein the original threshold voltage is an average of threshold voltages of the plurality of spare memory cells in the spare memory cell region which have not been undergone the plurality of program-erase cycles.

3. The non-volatile memory device of claim 2, wherein the original threshold voltage is the average of the threshold voltages of the plurality of spare memory cells after undergoing the weak erasing operation.

4. The non-volatile memory device of claim 1, wherein the adjusted erase verify voltage level is an initial erase verify voltage level plus the voltage shift value, wherein the initial erase verify voltage level is a pre-determined value.

5. The non-volatile memory device of claim 1, wherein the control circuit is configured to perform a pre-programming operation on the main memory cell region before performing the weak erasing operation on the main memory cell region.

6. The non-volatile memory device of claim 1, wherein the control circuit is configured to perform a first erasing operation on the at least one of memory cells according to the first erase voltage, and perform a reverse reading operation on the at least one of memory cells after the first erasing operation, and determine whether to perform a second erasing operation on the at least one of memory cells according to a comparison result of a read result of the reverse reading operation and the adjusted erase verify voltage level, and a second erase voltage adopted in the second erasing operation is greater than the first erase voltage.

7. The non-volatile memory device of claim 1, further comprising the spare memory cell region, wherein the spare memory cell region comprises a spare memory cell which maintains unused after delivery, wherein the original threshold voltage is a threshold voltage of the spare memory cell.

8. The non-volatile memory device of claim 7, wherein the original threshold voltage is the threshold voltage of the spare memory cell after undergoing the weak erasing operation.

9. An erasing operation method of a non-volatile memory device including a plurality of memory cells, comprising:
obtaining a current threshold voltage of at least one of the memory cells to be erased, wherein the current threshold voltage is obtained from the at least one of the memory cells that have undergone a plurality of program-erase cycles;
calculating a difference between the current threshold voltage and an original threshold voltage to obtain a voltage shift value, wherein the original threshold voltage represents a pre-delivery threshold voltage of the plurality of memory cells;
adjusting an erase verify voltage level according to the voltage shift value; and
performing an erasing operation on the at least one of memory cells, wherein the erasing operation includes determining whether the erasing operation is completed according to the adjusted erase verify voltage level,
wherein the step of obtaining the current threshold voltage comprises:
performing a weak erasing operation on the at least one of the memory cells and a spare memory cell before obtaining the current threshold voltage, wherein the current threshold voltage is greater than 0 volt and smaller than a program verify voltage level after the weak erasing operation.

10. The erasing operation method of claim 9, further comprising:
obtaining a threshold voltage of the spare memory cell of the non-volatile memory device; and
generating the original threshold voltage according to the threshold voltage of the spare memory cell, wherein the original threshold voltage is an average of threshold voltages of the plurality of spare memory cells in the spare memory cell region which have not been undergone the plurality of program-erase cycles.

11. The erasing operation method of claim 10,
wherein the original threshold voltage is the threshold voltage of the spare memory cell after undergoing the weak erasing operation.

12. The erasing operation method of claim 9, wherein the adjusted erase verify voltage level is an initial erase verify voltage level plus the voltage shift value, wherein the initial erase verify voltage level is a pre-determined value.

13. The erasing operation method of claim 9, wherein the step of obtaining the current threshold voltage further comprises:
performing a pre-programming operation on the at least one of memory cells to be erased before performing the weak erasing operation.

14. The erasing operation method of claim 9, wherein the step of performing the erasing operation comprises:
setting a plurality of erase voltages which are sequentially incremented;
performing the erasing operation for a plurality of times on the plurality of memory cells according to the plurality of erase voltages, respectively;
performing a reverse reading operation on the memory cell after each of the erasing operation; and
determining whether to continue the next erasing operation according to a comparison result of a read result of the reverse reading operation and the adjusted erase verify voltage level.

* * * * *